United States Patent
Williamson et al.

(10) Patent No.: US 12,085,851 B2
(45) Date of Patent: Sep. 10, 2024

(54) PRESSURE SENSOR MANIFOLD WITH INCREASED PHOTOCURABLE RESISTANCE

(71) Applicant: CANON KABUSHIKI KAISHA, Tokyo (JP)

(72) Inventors: John D. Williamson, Thorndale, TX (US); Steven C. Shackleton, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 988 days.

(21) Appl. No.: 17/035,331

(22) Filed: Sep. 28, 2020

(65) Prior Publication Data
US 2022/0100083 A1 Mar. 31, 2022

(51) Int. Cl.
G01L 9/00 (2006.01)
G01L 19/00 (2006.01)
G03F 7/00 (2006.01)
H01L 21/027 (2006.01)

(52) U.S. Cl.
CPC .......... G03F 7/0002 (2013.01); G01L 9/0041 (2013.01); G01L 19/0007 (2013.01); H01L 21/0271 (2013.01)

(58) Field of Classification Search
None
See application file for complete search history.

(56) References Cited

U.S. PATENT DOCUMENTS

| | | | | |
|---|---|---|---|---|
| 3,818,765 A | * | 6/1974 | Eriksen | G01L 9/006 73/706 |
| 4,072,056 A | * | 2/1978 | Lee | A61B 5/0215 73/706 |
| 4,462,409 A | * | 7/1984 | Pace | A61B 5/0215 73/706 |
| 4,795,440 A | * | 1/1989 | Young | A61M 5/16854 604/122 |
| 5,115,676 A | * | 5/1992 | Lee | G01L 9/0072 361/283.4 |
| 5,410,916 A | * | 5/1995 | Cook | G01L 19/0023 73/431 |
| 5,575,632 A | * | 11/1996 | Morris | A61M 5/14228 417/474 |
| 5,644,285 A | * | 7/1997 | Maurer | G01L 19/0038 338/42 |
| 7,021,148 B2 | * | 4/2006 | Kuhn | A61M 1/3639 73/714 |

FOREIGN PATENT DOCUMENTS

EP 0735353 A1 10/1996

* cited by examiner

*Primary Examiner* — Brandi N Hopkins
*Assistant Examiner* — Nigel H Plumb
(74) *Attorney, Agent, or Firm* — Canon U.S.A., Inc. I.P. Division (57) ABSTRACT

A pressure sensor manifold is provided that resolves issues caused by accumulated particles and bubbles to improve print head performance. The pressure sensor manifold includes a fluid inlet, a fluid outlet, and a dome-shape cavity connecting with both the fluid inlet and the fluid outlet. The fluid inlet has a first interior cross-section, and the fluid outlet has a second interior cross-section. The dome-shape cavity has an apex. A line that is tangential to the apex passes through a plurality of points on both the first interior cross-section of the fluid inlet and the second interior cross-section of the fluid outlet.

15 Claims, 6 Drawing Sheets

PRESSURE SENSOR MANIFOLD WITH INCREASED PHOTOCURABLE RESISTANCE

BACKGROUND

Field of Art

The present disclosure relates to substrate processing, and more particularly, to a manifold structure for a pressure sensor.

Description of the Related Art

As the demand for microfabrication of semiconductor devices or MEMS increases, "imprint technique" that molds an uncured resin supplied to a substrate (wafer) by a mold to form a resin pattern on the substrate have been receiving attention. The imprint technique allows a fine structure to be formed with dimensions of a few nanometers on a substrate. One example of imprint techniques includes a photo-curing method. An imprint apparatus employing the photo-curing method first supplies an uncured resin (photocurable resin) to a patterning region on a substrate. The resin on the substrate is brought into contact with (is molded against) the mold with a pattern thereon. The resin is cured by irradiation of light while the resin is in contact with the mold. By expanding a space between the substrate and the mold (by releasing the mold from the cured resin), a resin pattern is formed on the substrate.

To manufacture an article, for example, a semiconductor device, an imprint apparatus may use a fluid dispenser to deliver drops of photocurable resist onto a substrate. The pressure of the photocurable resist flowing in and out of the fluid dispenser has to be carefully measured and controlled to ensure the quality of the photocurable resist delivered on the substrate. Pressure sensors are housed in manifolds along the incoming and outgoing flow paths of the photocurable resist to perform the pressure measurement. Conventional mounting of pressure sensors in the manifold housing relies on an O-ring seal around an outer body of the pressure sensor to provide a leak proof seal. Due to the clearance required to insert the sensor into the manifold body, there is a gap where fluid can accumulate and become stagnant above the O-ring location. The stagnant fluid can contain particles that are difficult to flush during cleaning operations. Additionally, the weld flange typically found on weld ring pressure sensors causes a large hold up volume of liquid and an area where bubbles could accumulate if the sensor is not oriented perpendicular to a vertical fluid path. These particles and bubbles seriously affect the accuracies of pressure measurements and degrades the quality of the resist applied to the substrate.

SUMMARY

A pressure sensor manifold is provided. The pressure sensor manifold includes a fluid inlet, a fluid outlet, and a dome-shape cavity connecting with both the fluid inlet and the fluid outlet. The fluid inlet has a first interior cross-section, and the fluid outlet has a second interior cross-section. The dome-shape cavity has an apex. A line that is tangential to the apex passes through a plurality of points on both the first interior cross-section of the fluid inlet and the second interior cross-section of the fluid outlet. The pressure sensor manifold may further comprise a chamber adjacent to the dome-shape cavity. The chamber is configured to accommodate a pressure sensor therein. In one embodiment, the chamber defines a space conformal to the pressure sensor. The chamber may include a structure allowing a sealing structure to be installed between the sensor and the chamber. The sealing structure may include an O-ring, for example. The chamber may include a compliant wall to create a conformal sealing surface around the sealing structure. Preferably but optionally, the chamber has a cylindrical shape. The pressure sensor manifold may be mounted to a fluid path of a fluid supply unit with the dome-shape cavity on top of a chamber for accommodating a pressure sensor along a vertical line.

A fluid supply system for supplying fluid to a fluid dispenser is provided. The fluid supply system comprises a fluid path for supplying fluid to the fluid dispenser and receiving fluid discharged from the fluid dispenser, at least a pressure sensor in fluid communication with the fluid path; and at least a manifold mounted to the fluid path. The manifold comprises a dome-shape cavity intersecting with the fluid path to form a fluid inlet and a fluid outlet and a chamber adjacent to the dome-shape cavity. The chamber is configured to accommodate the pressure sensor therein. The dome-shape cavity has an apex and a line that is tangential to the apex passes through a plurality of points on an interior cross-section of each of the fluid inlet and the fluid outlet. The fluid path may include a fluid supply line for supplying fluid to the dispenser and a fluid recovery line for receiving fluid discharged from the dispenser. The chamber may further comprise a structure allowing a sealing structure to be inserted between the pressure sensor and the chamber. In one embodiment, the sealing structure may include an O-ring. The chamber may also include a compliant wall to create a conformal sealing surface around the sealing structure. The manifold may be mounted to the fluid path with the dome-shape cavity placed on top of the chamber.

A method of manufacturing an article is provided. The method comprises the following steps. A formable material is supplied from a fluid supply unit to a fluid dispenser. A pressure of the fluid supplied to the fluid dispenser is controlled. The formable material is dispensed from the fluid dispenser onto a substrate. A template is advanced to be in contact with the fluid dispensed on the substrate. The formable material is solidified to form a solid layer on the substrate that has a pattern conforming to a shape of the surface of the advanced template. The template is then removed from the solidified layer. The substrate with the solidified layer is processed to make the article. In one embodiment, the pressure is controlled based on a measurement by a pressure sensor installed in a manifold mounted to a fluid path of the fluid supply unit. The manifold includes a dome-shape cavity intersecting with the fluid supply line to form a fluid inlet and a fluid outlet and a chamber adjacent to the dome-shape cavity configured to accommodate the pressure sensor. The dome-shape cavity has an apex and a line that is tangential to the apex passes through a plurality of points on an interior cross-section of each of the fluid inlet and the fluid outlet.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Imprint System

Figure 1:
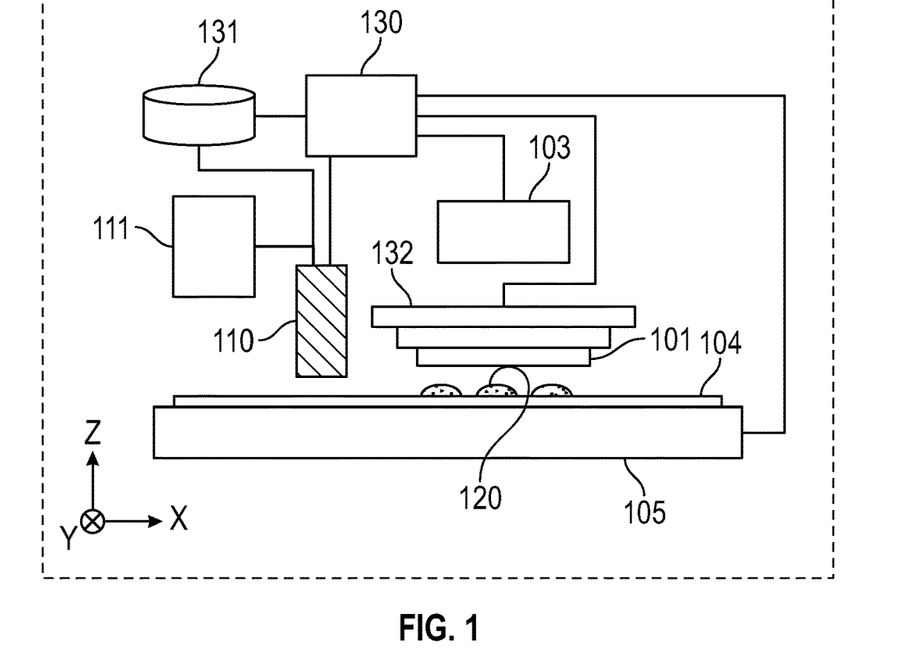
FIG. 1 is a diagram illustrating a configuration of an imprint apparatus.

FIG. 1 illustrates a diagram of an imprint lithography apparatus 100. The imprint apparatus 100 may be used to manufacture articles such as semiconductor devices in the nanoscale. The imprint apparatus 100 contacts an original pattern 101 (template) with a formable material, that is, an uncured resin (resist) 120, applied to a substrate (wafer) 104 to transfer an inverse image of the pattern 101 to the substrate 104. In the current embodiment, a photo-curing method is used for curing the formable material by irradiation of ultraviolet light. The imprint apparatus 100 includes a template chuck 102 for holding the template (the original pattern) 101, an ultraviolet radiating unit 103 to generate the ultraviolet light, a stage for supporting the substrate 104, a fluid dispenser 110 for applying the formable material onto the substrate 104, a fluid supply 111 for supplying the formable material 120 to the fluid dispenser 110, a controller 130, and an applying pattern storage unit 131. The formable material 120 is supplied from the fluid supply 111 by movement, for example, scan movement or step movement, of the stage 105. The controller 130 includes a processor such as a CPU, a memory or the like to control the respective units of the imprint apparatus 100. In an embodiment, the pattern may be featureless and may be used to form a planar surface.

In the imprint process, the desired original pattern, that is, the template 101, is held by the template chuck 102. The dispenser 110 is prepared and mounted on the imprint apparatus 100 to apply the formable material 120 to the substrate 104. At this time, the stage 105 may move in accordance with the formable material application pattern, and the dispenser 110 sequentially drips the resin 120 on the substrate 104. The template 101 is then brought in a close proximity of the substrate 104 and pressed against the formable material 120 for a predetermined period of time, so that the original pattern of the template 101 is transferred to the formable material 120. The patterned formable material 120 is then cured by radiation of ultraviolet light by the ultraviolet radiating unit 103 for a predetermined period of time. The ultraviolet radiation unit 103 includes, for example, a halogen lamp, an LED, or other ultraviolet generating sources. The template 101 is then removed from the formable material 120. In an embodiment, a pattern area of the template is smaller than an area of the substrate that is to be patterned and one or more steps of the imprint process is performed repeatedly upon the substrate. In an embodiment, a pattern area of the template may be the same size or larger of an area of the substrate that is to be patterned and the imprint process is performed on the whole substrate.

Fluid Supply Unit

Figure 2:
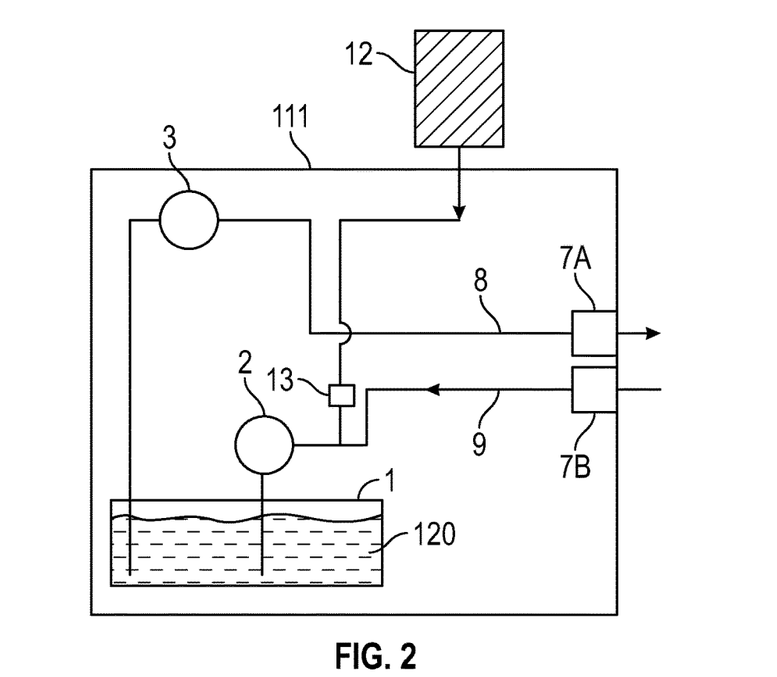
FIG. 2 is a diagram illustrating a configuration of a fluid supply.

FIG. 2 shows an exemplary configuration of the fluid supply 111 for supplying the formable material 120 to the substrate 104 via the fluid dispenser 110. As shown, the formable material 120 is supplied from a supply source tank 12 to a storage main tank 1. The formable material 120 is refilled to the storage main tank 1 by opening a three-way valve 13 installed between the supply source tank 12 and the storage main tank 1. The three-way valve 13 allows the formable material 120 supplied from the source tank 12 to the storage main tank 1 while the flow from the fluid dispenser 110 to the storage main tank 1 is shutoff. The three-way valve 13 also allows the formable material to flow from the fluid dispenser 110 to the storage main tank 1 while the flow from the source tank 12 is shut off. Once the storage main tank 1 is refilled to a predetermined amount of the formable material from the source tank 12, the three-way valve 13 shuts off the fluid communication with the source tank 12 and opens the flow communication with the fluid dispenser 110. The fluid supply 111 includes a negative pressure pump 2 and a positive pressure pump 3. The formable material 120 is supplied from a fluid supply line 8 to the fluid dispenser 110. The remaining formable material 120 is discharged from the fluid dispenser 110 to the storage main tank 1 via a fluid recovery line 9.

A pressure sensor 7A for monitoring a supply pressure, that is, the pressure of the formable material 120 flowing into the fluid dispenser 110, is installed at the fluid supply line 8. A pressure sensor 7B for monitoring a recovery pressure, that is, the pressure of the formable material 120 discharged from the fluid dispenser 110, is installed at the fluid recovery line 9. The pressure measurements from the pressure sensors 7A and 7B allow the controller 130 to maintain a positive pressure at the outlet of the fluid supply line 8 and a negative pressure at an inlet of the fluid recovery line 9. In addition to the positions as shown in FIG. 2, the pressure sensors 7A and 7B can be mounted to any parts of the fluid flow path as desired. As discussed above, the pressure sensors 7A and 7B are housed in a manifold mounted to the fluid paths, that is, the fluid supply line 8 and the fluid recovery line 9. The conventional welded pressure sensors mounted in standard receptacles, that is, the manifolds, create stagnant fluid areas where air bubbles and particles can accumulate. The accumulation of bubbles significantly affects the pressure readings that lead to errant pressure control and consequently affects print head performance and reliability. The randomly dislodged particles may clog narrow print head fluid channels and nozzles to further affect the print head performance reliability.

Pressure Sensor/Manifold Structure

Figure 3A:
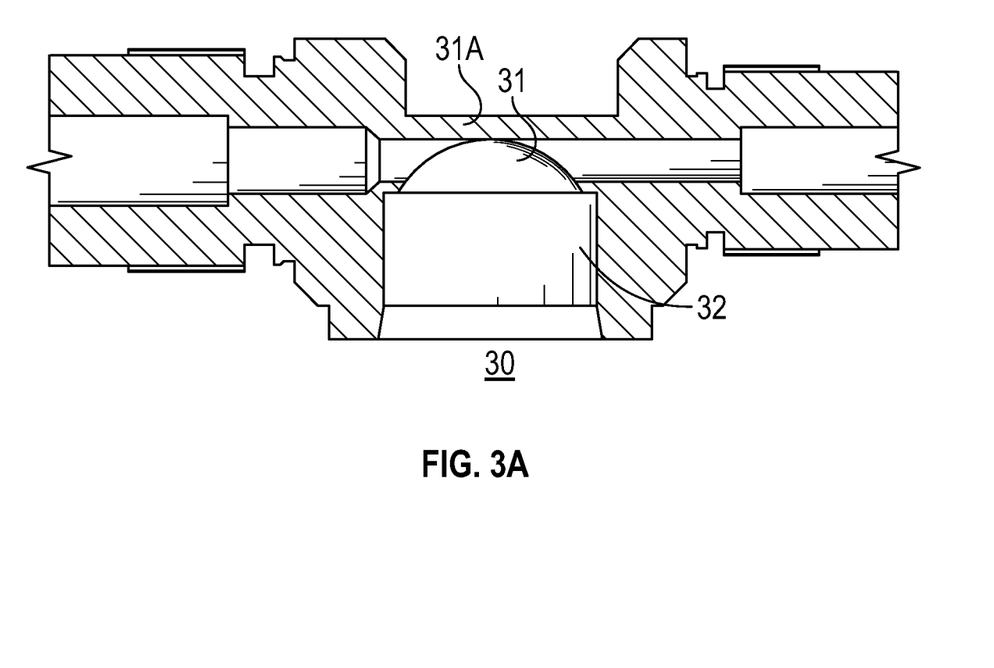
FIG. 3A shows a cross sectional view of the manifold installed at the fluid flow path of the fluid supply.

To resolve the issues caused by the particles and bubbles accumulated in the manifolds so as to improve the print head performance, a manifold structure having a domed cavity in line with the fluid flow path is provided according to one embodiment of the current application. FIG. 3A shows a cross sectional view of the manifold installed at the fluid flow path, for example, the fluid supply line 8 and the fluid recovery line 9. The manifold 30 includes a dome-shape cavity portion 31 and a chamber portion 32. As shown in FIG. 3A, the manifold 30 is mounted to the fluid flow path with the dome-shape portion 31 at the top and the chamber portion 32 at the bottom. The dome-shape cavity portion 31 has a concave upper surface and a flush lower surface and defines a cavity 31C. The dome-shape cavity portion 31 intersects with the fluid flow path such that the cavity 31C merges with the fluid flow path at an apex 31A at the concave upper surface. The flush lower surface of the cavity 31C minimizes hold up volume in the cavity and reduces the volume of fluid and particles that can be trapped. The concave (domed) upper surface guides bubbles towards the flow path at the apex 31A of the manifold 30 (see FIG. 3C). In the embodiment as shown in FIG. 3A, the chamber portion 32 has a cylindrical shape to define a cylindrical chamber for accommodating a pressure sensor 7A/7B therein. Depending on the structures and specifications of the pressure sensor to be used, the chamber portion 32 may also be designed in other shapes.

Figure 3B:
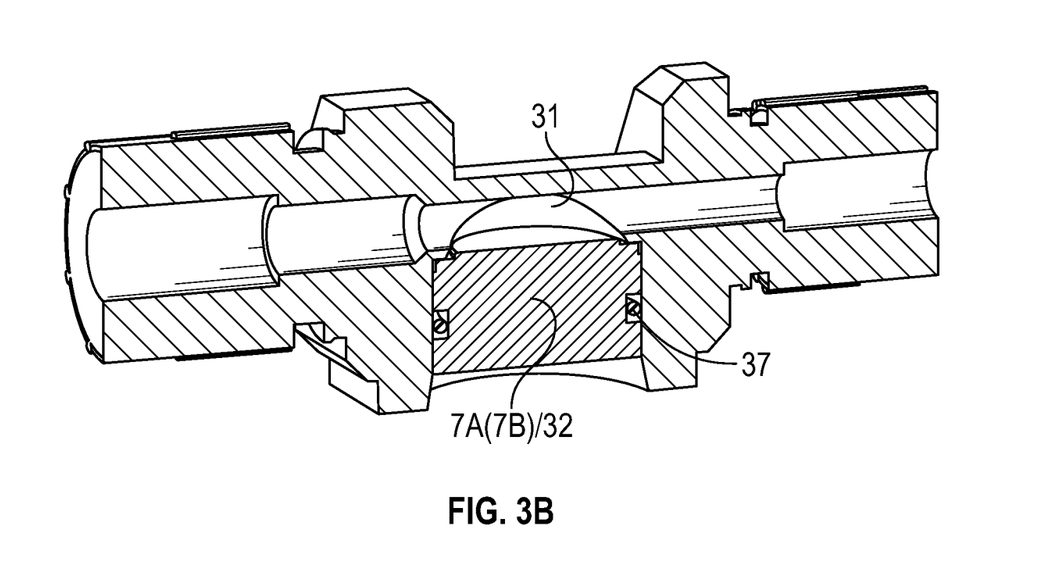
FIG. 3B is a cross sectional view of the manifold along line A-A' in FIG. 3C.
Figure 3C:
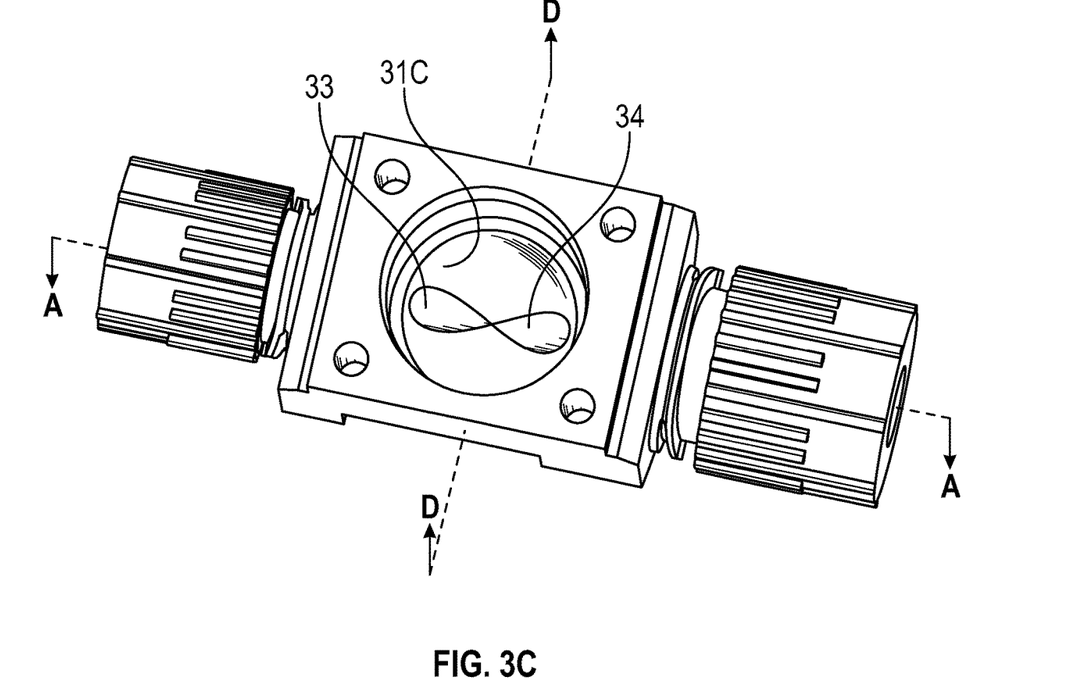
FIG. 3C shows the interior structure of the dome-shape portion of the manifold.
Figure 4:
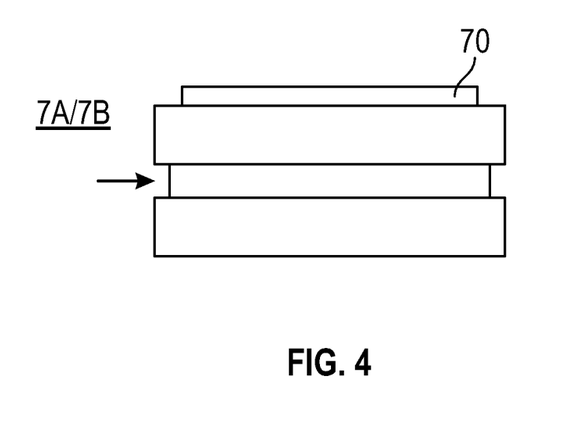
FIG. 4 shows a side view of a pressure sensor in one embodiment.

FIG. 3B shows a cross sectional view of the manifold along the line A-A' as shown in FIG. 3C. In the embodiment as shown in FIG. 3B, a flangeless weld ring pressure sensor may be used to create a flush sensing surface and reduce fluid hold-up volume. In contrast with the traditional pressure sensors that holds the sensing element in a recessed pocket, the flush face sensor 7A(7B) includes a flush face diaphragm 70 as shown in FIG. 4. The flush face diaphragm 70 at the top is adjacent to the flush lower surface of the cavity 31C to prevent creation of a stagnant region of the fluid flowing through. In an embodiment an O-ring 37 is circling around the perimeter of the sensor 7A (7B) to function as a seal to provide a leak proof effect for installation in the chamber portion 32. In one embodiment, the thickness of the diaphragm 70 is about 0.50 mm. The recessed region for accommodating the O-ring 37 as indicted by the arrow in FIG. 4 is about 2.4 mm. The dimensions of the sensors 7A(7B) may vary according to the specific needs of the fluid supply system. As shown in FIG. 3B the cavity defined by dome-shape portion 31 is adjacent to the sensing diaphragm 70 of the pressure sensor 7A (7B).

Figure 3D:
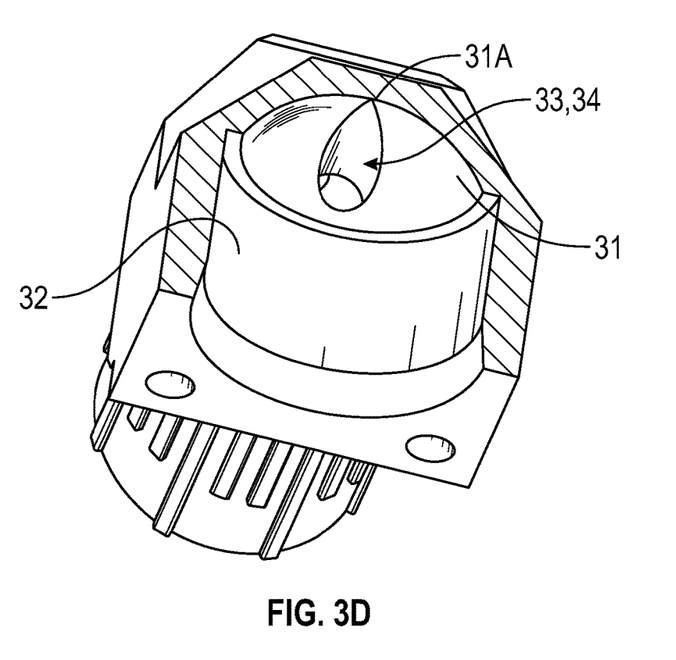
FIG. 3D shows is a cross sectional view of the manifold along line D-D' in FIG. 3C.

FIG. 3C shows the interior structure of the manifold 30 viewing from the bottom. The dome-shape portion 31 intersects with the fluid flow path to define a fluid inlet 33 and a fluid outlet 34. In the example as shown in FIG. 3C, the fluid inlet 33 and the fluid outlet 34 are aligned with each other and symmetrical about the apex 31A. Referring to both FIGS. 3A and 3B, the dome-shape cavity portion 31 is tangential with the fluid flow path at the apex 31A. Therefore, the fluid inlet 33 and the fluid outlet 34 connect with the cavity 31C and a line that is tangential to the apex 31A passes through a plurality of points on the interior cross-sections of both the fluid inlet 33 and the fluid outlet 34. The dome shape of the cavity 31C guides the fluid to flow towards the fluid outlet 34 as shown in FIG. 3C. FIG. 3D shows another cross sectional view of the manifold cutting along the line D-D' as shown in FIG. 3C. As shown, the fluid inlet 33 or fluid outlet 34 is directly connected to the fluid supply line or the fluid recovery line.

Figure 3E:
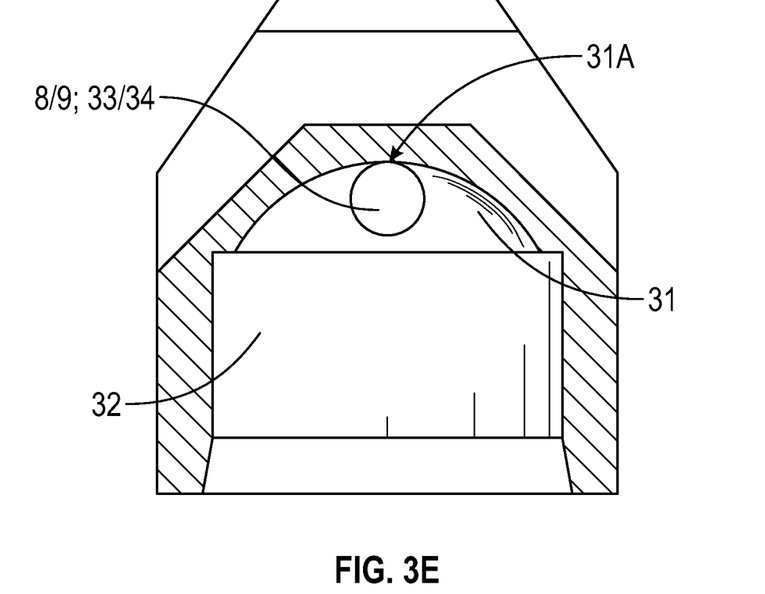
FIG. 3E shows a cross sectional view of the manifold along a line perpendicular to the fluid supply/recovery line.
Figure 3F:
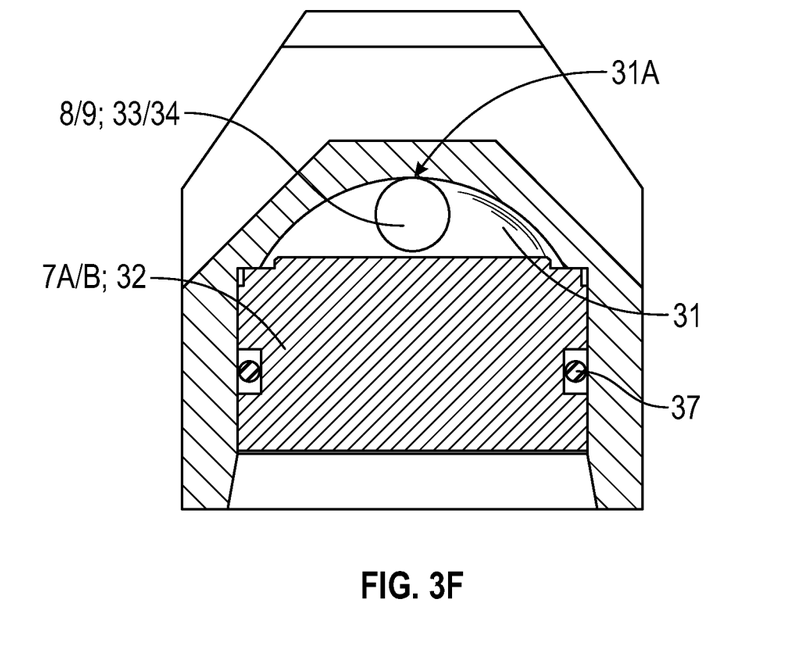
FIG. 3F shows the cross sectional view of the manifold in FIG. 3E with a pressure sensor installed therein.

FIG. 3E shows another cross sectional view of the manifold 31 cutting along a line D-D' perpendicular to line A-A'. As shown in this cross-sectional view, the fluid flow path, including the fluid supply line 8 and the fluid recovery line 9 extend tangential to the apex 31A of the dome-shape portion 31 of the manifold 30. In FIG. 3F, a pressure sensor 7A/7B is installed in the chamber portion 32 of the manifold 30. The O-ring 37 surrounding along a sidewall of the pressure sensor 7A/7B is denoted by the circles at two sides of pressure sensor 7A/7B. Once the sensors 7A/7B is installed in the manifold 31, the O-ring 37 overlapped with the sensor 7A/7B may be deformed.

Figure 3G:
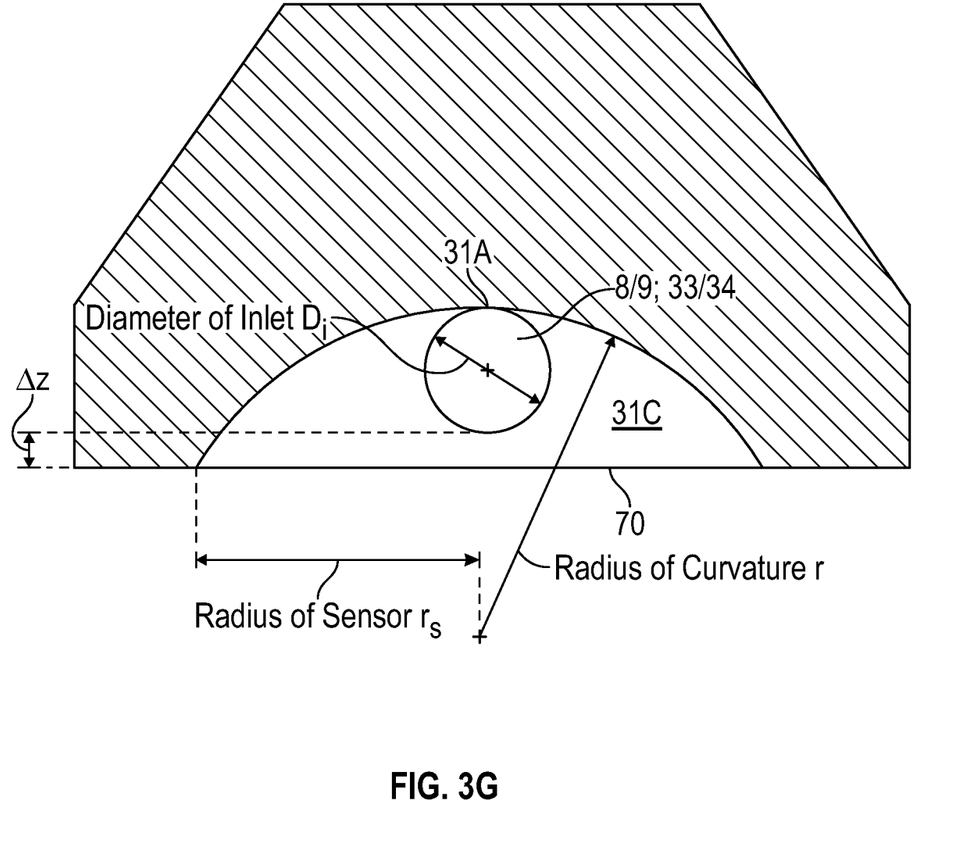
FIG. 3G shows the cross sectional view of a portion of the manifold in FIG. 3F.

In the traditional structures, O-rings are used to achieve proper sealing surface around the flush face of the pressure sensor. The thickness of the O-ring often may form a cavity that traps fluid. Instead of using the O-ring, the manifold may be made of compliant material to provide a sealing surface against the flush face of the pressure sensor, so as to eliminate areas of trapped fluid and further minimize fluid hold-up after system drain and shut down. In one embodiment, the material for fabricating the manifold may have a hardness between about Shore D50 and Shore D60 per ASTM D 2240, for example. In an embodiment, the manifold 30 is made of a compliant material and there is no O-ring 37 between the pressure sensor 7A/7B and the manifold 30. In an alternative embodiment, the manifold 30 is made of a compliant material and there is an O-ring 37 between the pressure sensor 7A/7B and the manifold 30 as illustrated in FIG. 3B. In an embodiment, FIG. 3G is a schematic illustrating the radius of curvature $R_C$ of the concave upper surface of the cavity 31C relative to the inner diameter D of the fluid inlet 33 and the fluid outlet 34, and a sensing radius $R_S$ of the sensing diaphragm 70 of the pressure sensor 7A (7B). In an embodiment, the radius of curvature $R_C$ is bound by equations (1) below. In an embodiment, inner diameter D of the fluid inlet 33 is less than one third of the sensing radius $R_S$ of the sensing diaphragm 70 of the pressure sensor 7A (7B). In an embodiment, the fluid flow path extends tangential to the apex 31A of the dome-shape portion 31 of the manifold 30 and the radius of curvature is $R_C$ is bound by equation (1) and a distance $\Delta z$ between a bottom of the fluid flow path and the sensing diaphragm is zero or some small value. In an embodiment, the distance $\Delta z$ is less than half the inner diameter D.

$$\frac{R_S^2 + D^2}{2D} \le R_C \le R_S \qquad (1)$$

$$D \le R_S$$

Figure 5:
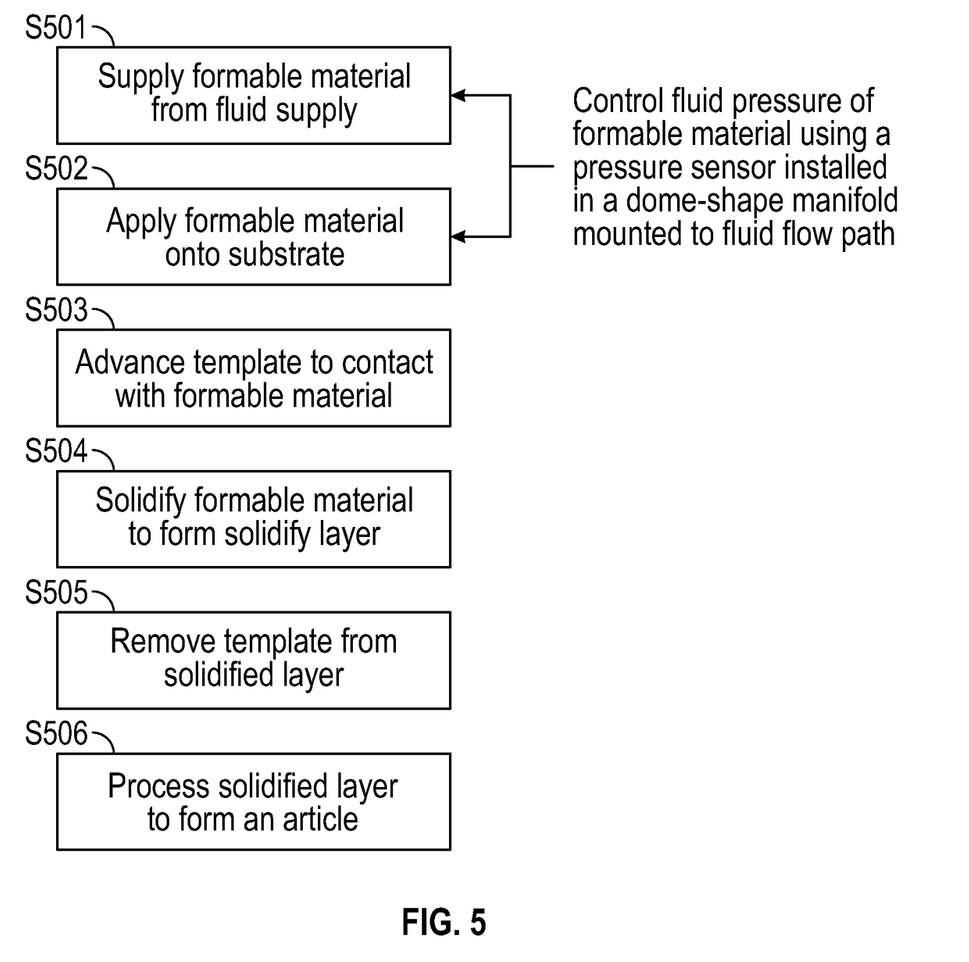
FIG. 5 shows a flow chart of a method for manufacturing an article using the manifold as shown in FIG. 1 to FIG. 4.

FIG. 5 shows a flow chart for manufacturing an article using the manifold as described above. In step S501, a formable material is supplied from a fluid supply unit to a fluid dispenser. While supplying the formable material, the fluid pressure of the formable material has to be properly controlled. The formable material is dispensed on a substrate in step S502. A template is then advance to be in contact with the formable material dispensed on the substrate in step S503. The formable material is then solidified with a pattern conforming to a shape of the surface of the template in step S504. The template is removed from the solidified layer in step S505. The substrate with the solidified layer is further processed to form the desire article in S506. In step S501 and S502, the fluid pressure is controlled based on a measurement by a pressure sensor installed in a manifold mounted to a fluid path of the fluid supply unit. The manifold includes a dome-shape cavity intersecting with the fluid supply line to form a fluid inlet and a fluid outlet and a chamber adjacent to the dome-shape cavity configured to accommodate the pressure sensor; and the dome-shape cavity has an apex and a line that is tangential to the apex passes through a plurality of points on an interior cross-section of each of the fluid inlet and the fluid outlet.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A pressure sensor manifold, comprising:
   a fluid inlet having a first interior cross-section;
   a fluid outlet having a second interior cross-section; and
   a dome-shape cavity having an apex, wherein the fluid inlet and the fluid outlet connect with the cavity and wherein a line that is tangential to the apex passes through a plurality of points on both the first interior cross-section of the fluid inlet and the second interior cross-section of the fluid outlet.

2. The pressure sensor manifold of claim 1, further comprising a chamber adjacent to the dome-shape cavity, the chamber being configured to accommodate a pressure sensor therein.

3. The pressure sensor manifold of claim 2, wherein the chamber defines a space conformal to the pressure sensor.

4. The pressure sensor manifold of claim 2, wherein the chamber includes a structure allowing a sealing structure to be installed between the sensor and the chamber.

5. The pressure sensor manifold of claim 4, wherein the sealing structure includes an O-ring.

6. The pressure sensor manifold of claim 4, wherein at least the chamber includes a compliant wall to create a conformal sealing surface around the sealing structure.

7. The pressure sensor manifold of claim 2, wherein the chamber has a cylindrical shape.

8. The pressure sensor manifold of claim 1, wherein the pressure sensor manifold is mounted to a fluid path of a fluid supply unit with the dome-shape cavity on top of a chamber for accommodating a pressure sensor along a vertical line.

9. A fluid supply system for supplying fluid to a fluid dispenser, comprising:
   a fluid path for supplying fluid to the fluid dispenser and receiving fluid discharged from the fluid dispenser;
   at least a pressure sensor in fluid communication with the fluid path; and
   at least a manifold mounted to the fluid path, comprising:
   a dome-shape cavity intersecting with the fluid path to form a fluid inlet and a fluid outlet; and
   a chamber adjacent to the dome-shape cavity, the chamber being configured to accommodate the pressure sensor therein,
   wherein the dome-shape cavity has an apex and a line that is tangential to the apex passes through a plurality of points on an interior cross-section of each of the fluid inlet and the fluid outlet.

10. The fluid supply system of claim 9, wherein the fluid path includes a fluid supply line for supplying fluid to the dispenser.

11. The fluid supply system of claim 9, wherein fluid path includes a fluid recovery line for receiving fluid discharged from the dispenser.

12. The fluid supply system of claim 9, wherein the chamber further comprises a structure allowing a sealing structure to be inserted between the pressure sensor and the chamber.

13. The fluid supply system of claim 12, further comprising the sealing structure includes an O-ring.

14. The fluid supply system of claim 12, wherein the chamber includes a compliant wall to create a conformal sealing surface around the sealing structure.

15. The fluid supply system of claim 9, wherein the manifold is mounted to the fluid path with the dome-shape cavity placed on top of the chamber.

* * * * *